United States Patent [19]
Gibbs

[11] Patent Number: 5,303,248
[45] Date of Patent: Apr. 12, 1994

[54] LASER APPARATUS AND METHOD EMPLOYING DIGITAL FILTER CONTROLLED PULSE WIDTH MODULATION

[75] Inventor: David M. Gibbs, Apopka, Fla.

[73] Assignee: Litton Systems, Inc., Beverly Hills, Calif.

[21] Appl. No.: 24,373

[22] Filed: Mar. 1, 1993

[51] Int. Cl.$^5$ .............................................. H01S 3/10
[52] U.S. Cl. ...................................... 372/25; 372/30; 372/38; 372/75
[58] Field of Search ...................... 372/25, 38, 75, 29, 372/30, 26

[56] References Cited

U.S. PATENT DOCUMENTS

| | | | |
|---|---|---|---|
| 4,794,603 | 12/1988 | Koseki | 372/38 |
| 4,888,777 | 12/1989 | Takeyama | 372/38 |
| 4,998,257 | 3/1991 | On et al. | 372/38 |
| 5,140,603 | 8/1992 | Anderson, Jr. et al. | 372/38 |
| 5,144,631 | 9/1992 | Okino | 372/25 |
| 5,157,675 | 10/1992 | Takagi | 372/24 |
| 5,226,051 | 7/1993 | Chan et al. | 372/30 |

*Primary Examiner*—James W. Davie
*Attorney, Agent, or Firm*—William M. Hobby, III

[57] ABSTRACT

A laser apparatus or system is provided including a driving mechanism for driving a pulsed semiconductor laser which injects optical energy into a lasing medium. A digital filter is employed to adjust the time duration or pulse width of drive pulses which excite the semiconductor laser. In this manner, the irradiation of the lasing medium is adjusted by pulse width modulation of the driving current in the semiconductor laser. The laser apparatus employs a sampled output, digitally filtered, negative feedback signal to drive the semiconductor laser. This structure has the effect of making the semiconductor laser responsive to changes in the laser system or to undesired degradation in the laser system. The laser apparatus compensates for the inherent time lag in laser output power energy during initial startup of the laser.

5 Claims, 5 Drawing Sheets

LASER APPARATUS AND METHOD EMPLOYING DIGITAL FILTER CONTROLLED PULSE WIDTH MODULATION

CROSS REFERENCE TO RELATED PATENT APPLICATIONS

This patent application is related to the copending patent application entitled "Laser apparatus And Method Employing Fuzzy Logic Based Pulse Width Modulation," Ser. No. 08/024,078, filed concurrently herewith and having the same assignee.

BACKGROUND OF THE INVENTION

This invention relates in general to drive circuits for laser apparatus and, more particularly, to pulse width modulation drive circuits for pulsed diode lasers.

Before discussing a conventional laser diode drive circuit, a conventional drive circuit 10 for a flashlamp-type laser transmitter 15 is shown in FIG. 1 for comparison purposes. The laser transmitter includes a flashlamp which excites a laser rod (both not shown). The transmitter also includes an energy monitor 20 which generates an ENERGY DATA output signal representative of the amplitude of the laser transmitter's optical output. The ENERGY DATA signal is fed through a transmitter electronics module 25 as an ENERGY STATUS signal. The ENERGY STATUS signal is supplied to a laser electronics module 30 which generates a high voltage adjust signal (HV Adjust). The HV ADJUST signal is fed to a programmable high voltage power supply, the output PROG. HV signal (pump voltage level) of which varies in accordance with the supplied HV ADJUST signal. The PROG. HV output signal (pump voltage level) is supplied to a pulse forming network (PFN) 40 including a capacitor in transmitter electronics module 25. The output of pulse forming network 40 supplies an ionization/PFN signal to laser transmitter 15 to drive the flashlamp exciter therein.

The drive circuit of FIG. 1 employs a control loop to adjust the output of the laser transmitter in the manner now described. The optical energy output of the laser transmitter is dependent on the pump voltage level (PROG. HV) supplied to the pulse forming network capacitor in the transmitter electronics module. The pump voltage level (PROG. HV) is programmed by, or controlled, by the present value of the HV Adjust signal generated by the laser electronics module. More specifically, using ENERGY DATA information sent back from the energy monitor in the laser transmitter (via the ENERGY DATA serial word data), an algorithm in the laser electronics module determines what adjustment of the pump voltage level (PROG. HV), if any, is needed to maintain a constant desired level of output energy. Thus, in this particular example wherein the laser transmitter includes a flashlamp cavity box, the optical output of the laser transmitter is maintained at a relatively constant amplitude by appropriately varying the pump voltage or drive voltage which is supplied to the laser flashlamp.

In contrast to the above described control loop of FIG. 1 wherein voltage is used to control the output of the flash lamp type laser transmitter, FIG. 2 shows a control loop and drive circuit which employs current to control the output of a laser diode type laser transmitter. FIG. 2 shows a laser diode driver circuit including an operational amplifier 100, the output of which is coupled to drive a field effect transistor 105 which is coupled in series with a laser diode 110, an energy storing capacitor 115 and a resistor 120. As noted above, one conventional approach to varying the output energy of the laser diode is to vary the amplitude of the current supplied to the laser diode. Another conventional technique for varying the output energy of the laser diode is to vary the pulse width of the input drive signal supplied to the input of the drive circuit at operational amplifier 100. Within certain bounds, the longer the pulse width supplied to the laser diode, the greater is the output which is generated by the laser up to the point of saturation. This is called pulse width modulation.

Unfortunately, conventional laser diode drive circuits such as shown in FIG. 2 do not enable the laser to stabilize quickly enough upon startup for some applications such as laser designator rangefinders, for example. Moreover, such drive circuits do not compensate for aging effects of the laser diode or other irregularities which enter the laser system. Also, temperature effects cause laser diode output wavelength shifts which, in general, decouple from the absorption region of the lasing medium (Nd:YAG rod) resulting in lower laser system output. Optics degradation, cooling medium "fogging" (if cooling the volume between laser diodes and lasing medium), and thermal effects on the lasing medium can result in undesired laser system output energy shifting when using laser diode drive circuits such as that in FIG. 2.

SUMMARY OF THE INVENTION

One object of the present invention is to provide a laser apparatus employing a semiconductor laser driving a lasing medium wherein the laser apparatus stabilizes very quickly upon startup.

Another object of the present invention is to provide a laser apparatus employing a semiconductor laser driving a lasing medium wherein the laser apparatus compensates for aging effects of the semiconductor laser.

Yet another object of the present invention is to provide a laser apparatus employing a semiconductor laser driving a lasing medium wherein the laser apparatus compensates for irregularities in the laser diode system.

In accordance with the present invention, a laser apparatus is provided which includes a laser source for generating a plurality of laser pulses in response to respective drive pulses in a drive signal. The laser apparatus also includes a sampling circuit for sampling the energy output of each the laser pulses to produce a sampled laser energy output signal including a plurality of laser energy output samples. The laser apparatus further includes an analog to digital converter, coupled to the sampling circuit for converting the sampled laser energy output signal to a digitized sampled signal including a plurality of digitized sample energy values. The laser apparatus also includes a digital filter, coupled to the analog to digital converter, for determining a respective filter value from each digitized sample energy value, the filter value being selected by the filter to cancel undesired response characteristics exhibited by the semiconductor laser source and the lasing medium. The laser apparatus still further includes a digital to analog converter, coupled to the digital filter, for converting each filter value to a count number. The laser apparatus also includes a driving circuit, coupled to the digital to analog converter, for generating a respective drive pulse in the drive signal from each count number, the duration of each drive pulse corresponding to a respective count number.

BRIEF DESCRIPTION OF THE DRAWINGS

The features of the invention believed to be novel are specifically set forth in the appended claims. However, the invention itself, both as to its structure and method of operation, may best be understood by referring to the following description and the accompanying drawings.

DETAILED DESCRIPTION OF THE INVENTION

Figure 1:
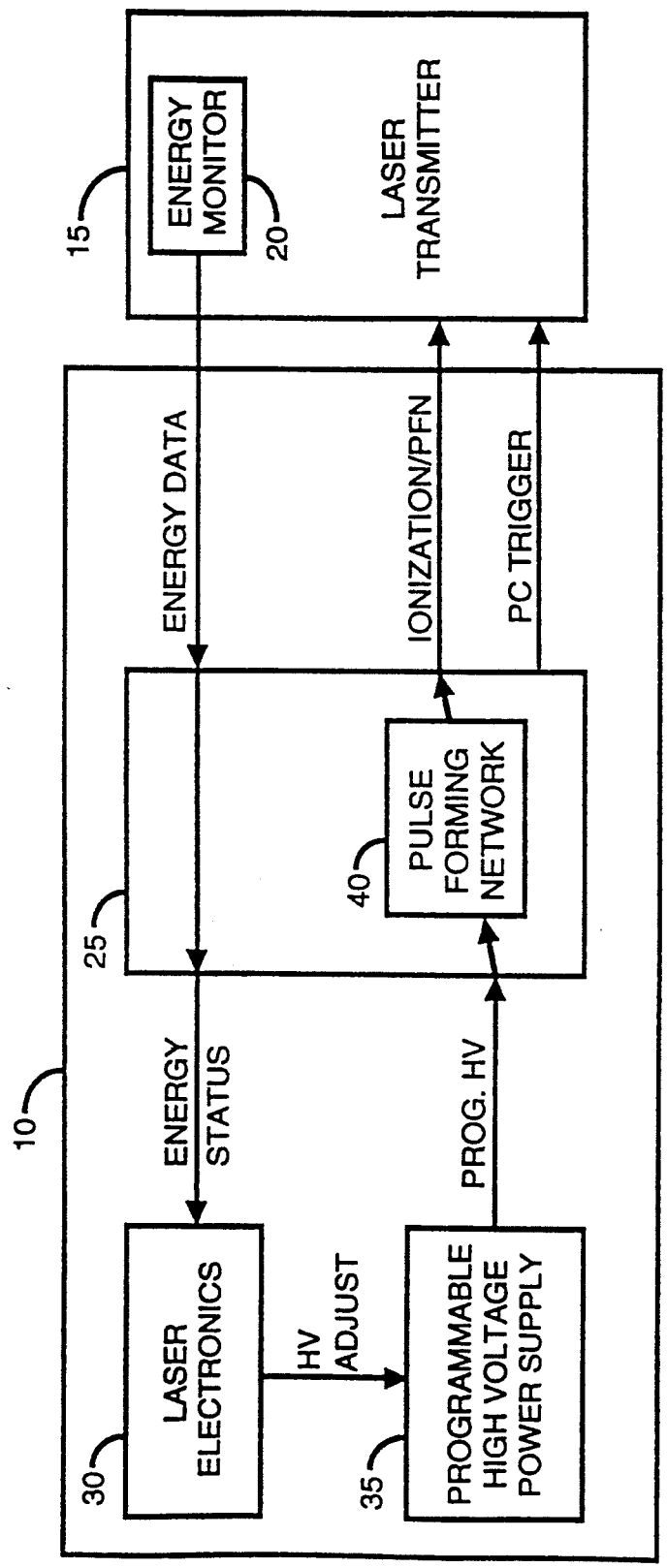
FIG. 1 is a block diagram of a conventional laser system employing a voltage control type control loop for controlling the output energy of a flash lamp type laser system.
Figure 3A:
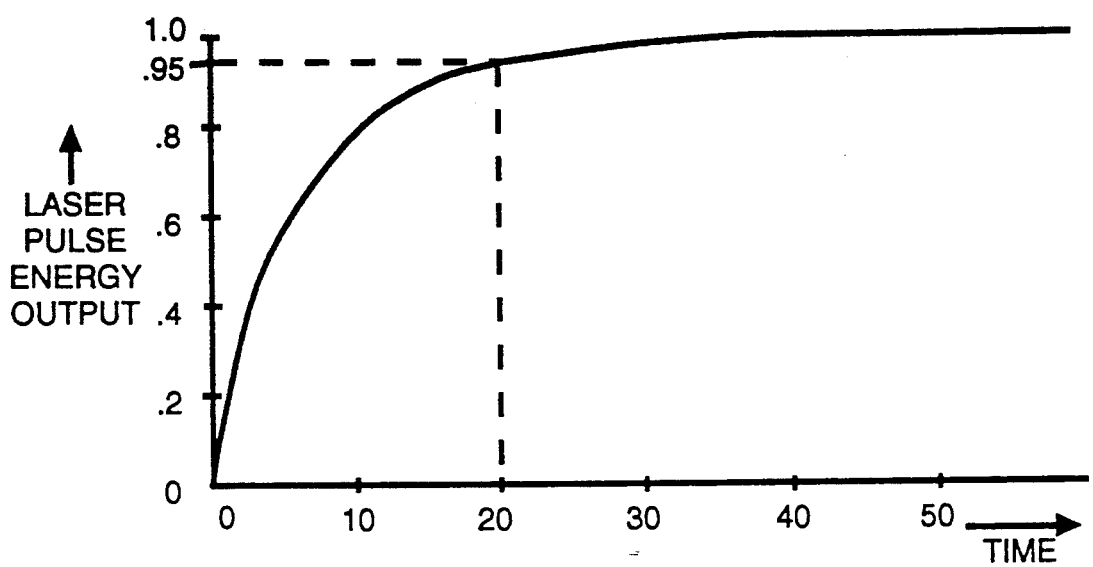
FIG. 3A is a laser pulse energy output vs. time graph for a conventional uncompensated laser system.

FIG. 3A is a graph of the laser output energy over time of a conventional laser transmitter such as that of laser transmitter 20 of FIG. 1. The horizontal axis of FIG. 3A is a relative time axis which depicts the number of pulses emitted by a conventional laser transmitter. In this example, it is seen that the laser transmitter must emit at least 20 laser output pulses before reaching 95% (or 0.95) of the desired laser output power. Such a response is regarded as being sluggish or too slow for many applications such as those described earlier.

Figure 3B:
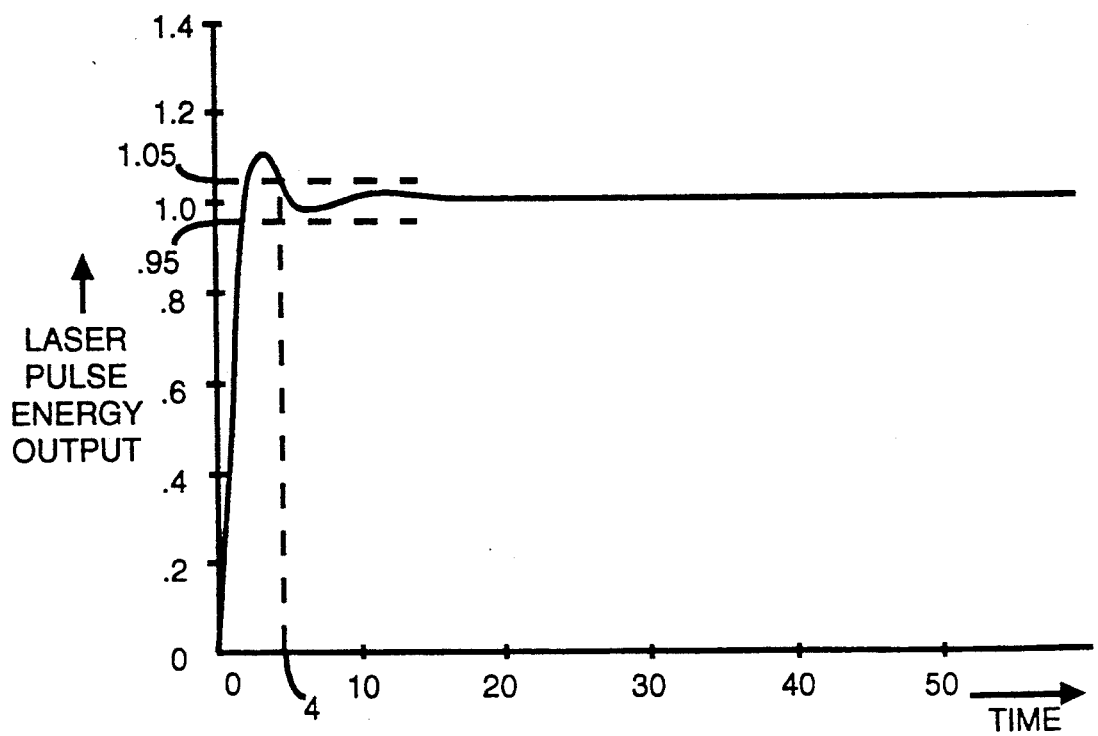
FIG. 3B is a laser pulse energy output vs. time graph for the digital filter compensated laser system of the present invention.

FIG. 3B is a graph of the laser output energy over time of the laser apparatus of the present invention. From FIG. 3B, it can be seen that the laser apparatus of the invention is able to emit nearly full output power very soon after laser startup. In particular, the laser apparatus of one particular embodiment of the invention, now described, is capable of stabilizing within 4 laser output pulses of initial startup as indicated in FIG. 3B.

Figure 4:
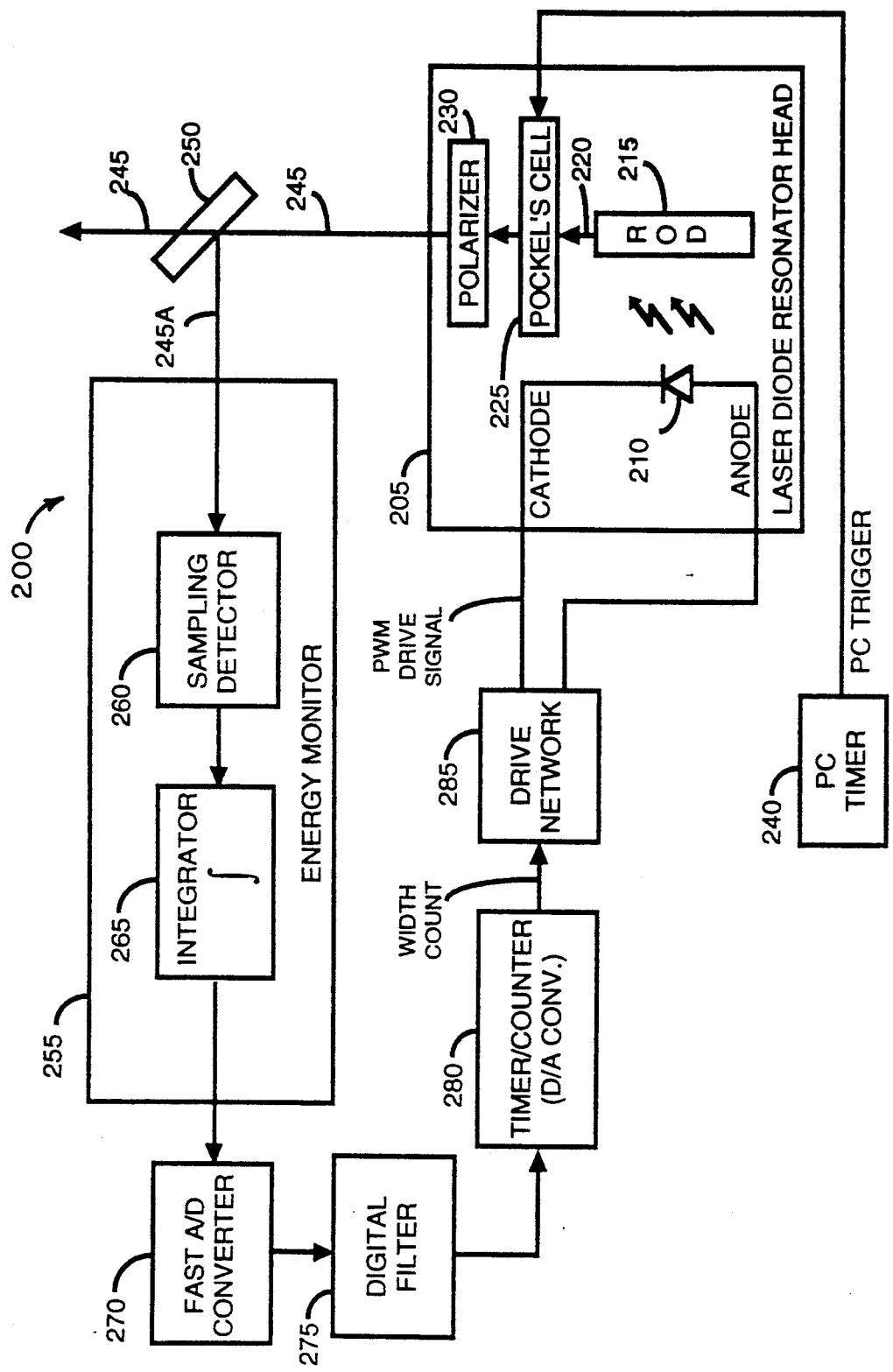
FIG. 4 is a block diagram of the digital filter compensated laser system of the present invention.

FIG. 4 shows a block diagram of the laser system of the present invention as laser system 200. Laser system 200 includes a laser diode resonator head 205 having a laser semiconductor or laser diode 210 which excites a laser rod 215. Laser diode 210 includes ANODE and CATHODE inputs as indicated. A pulse width modulated PWM DRIVE signal is supplied to laser diode 210 as will be described in more detail subsequently. The PWM DRIVE signal is depicted in the PWM DRIVE vs. time graph of FIG. 5A wherein several PWM DRIVE pulses of varying pulse width can be seen. It is noted that the longer the duration or width of the PWM DRIVE pulse provided to laser diode 210, then the longer is the resultant laser pulse which is generated by laser diode 210. The laser pulse emitted by laser diode 210 is incident on laser medium or rod 215 and pumps laser rod 215 causing it to emit a laser light beam 220.

Laser light beam 220 is intercepted by an electronic shutter formed by Pockel's cell 225 and polarizer 230 which are placed in the path of beam 220. This electronic shutter opens at predetermined times directed by the PC TRIGGER pulses 235 (FIG. 5B) in the PC TRIGGER signal generated by PC timer 240 and supplied to Pockel's cell 225. Each PC TRIGGER pulse 235 causes the electronic shutter to momentarily open for the duration of the PC TRIGGER pulse thus permitting a short duration laser pulse 245 to be emitted by laser head 205.

Figure 5A:
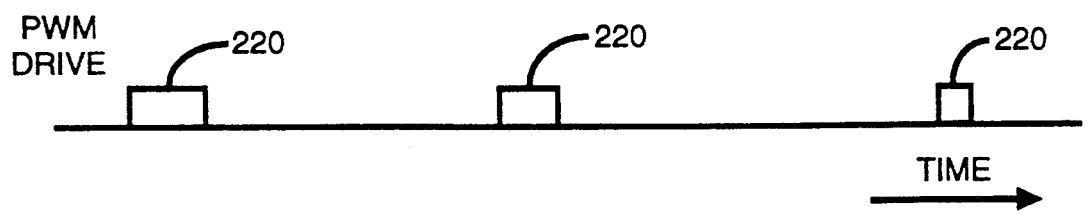
FIG. 5A is a graph of the PWM DRIVE signal vs. time.
Figure 5B:
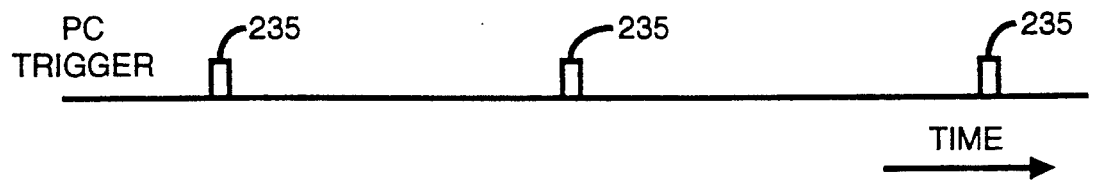
FIG. 5B is a graph of the PC TRIGGER signal vs. time.

In comparing FIGS. 5A and 5B it is seen that each PWM DRIVE pulse 220 of FIG. 5A has a corresponding PC TRIGGER pulse 235 in FIG. 5B. PC timer 240 monitors the PWM DRIVE signal and generates a PC TRIGGER pulse 235 each time the trailing edge of a PWM DRIVE pulse 220 occurs. Thus, each time laser diode 210 is driven with a PWM pulse to cause it to pump laser rod 215, the electronic shutter opens briefly under the direction of the corresponding PC TRIGGER pulse to emit a respective laser pulse 245.

Most of the energy content of laser pulses 245 passes through beam splitter 250. However, a small portion of each laser pulse 245 is deflected as laser pulse 245A to an energy monitor 255. Energy monitor 255 monitors the power output level associated with each laser pulse 245 with a sampling detector 260 which samples the laser power output level signal at predetermined sampling times discussed later in more detail. The resultant samples are integrated at integrator 265 to yield the energy in the pulse, which is then provided to a fast analog to digital (A to D) converter 270. A to D converter 270 converts the sampled energy level to a corresponding digital value (digitized sampled energy level) for later use.

The output of A to D converter 270 is coupled to a digital filter 275 such that the above-mentioned corresponding digital value is supplied to digital filter 275. Digital filter 275 takes the corresponding number from A to D converter 270 and using this value as data "calculates" the next PWM DRIVE pulse width which is supplied to laser diode 210 to drive the same. This calculation is based on a digital filter algorithm which is discussed in more detail later. Briefly however, the dynamics of a particular laser system are determined and a corresponding filter transfer function is employed which cancels out the undesired laser response (sluggishness in this case) and which compensates the laser system to make it respond as desired (more robustly in this case). The digital filter algorithm executed by digital filter 275 generates a respective digital filter number for each digitized sample energy level provided thereto.

Figure 2:
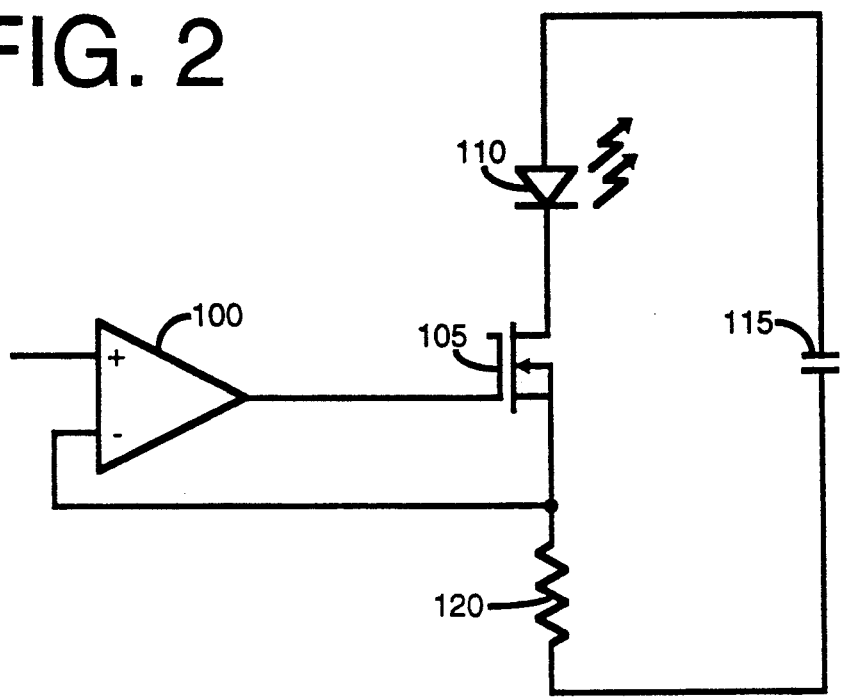
FIG. 2 is a schematic diagram of a conventional control circuit which varies a laser diode's current and pulse width to control the output energy of a laser diode type laser system.

The output of digital filter 275 is coupled to a timer/counter 280. Timer/counter 280 acts as a quasi-D/A converter which takes the digital filter number and generates a count (WIDTH COUNT) which is proportional to the desired PWM DRIVE pulse width. The WIDTH COUNT is provided to a drive network 285 which takes the low level logic signal, WIDTH COUNT, and converts it to a PWM DRIVE pulse having a duration corresponding to WIDTH COUNT and having an energy level sufficient to drive laser diode 210. One drive network which may be employed as drive network 285 is the drive network of FIG. 2 wherein laser diode 110 is not considered to be part of that drive network. Laser diode 210 then drives or pumps laser rod 215 for a duration of the particular pulse width counted out by timer/counter 280 as indicated by the duration of the PWM DRIVE signal.

Laser rod 215 receives the energy pumped into such rod by laser diode 210 and generates a high peak power, short duration laser pulse when the laser apparatus is Q-switched, namely when the Pockels cell is triggered by the PC TRIGGER signal and the electronic shutter opens.

The duration of the PWM DRIVE signal is thus digitally controlled by digital filter action on a pulse to pulse basis such that the laser apparatus stabilizes very quickly at the desired laser output level.

It is noted that the characteristics of the digital filter 420 which is used for compensating and correcting for undesired laser system responses will vary somewhat from a particular laser to a particular laser. To determine the characteristics of the particular digital filter employed as filter 420 it is important to first characterize the particular laser system for which compensation of undesired response characteristics is desired.

It has found that a laser head such as head 205 generally exhibits nearly a first order response. In other words, when the laser system is first turned on, the laser energy output 245 rises exponentially and asymptotically approaches the desired energy level as seen in the uncompensated case depicted in FIG. 3A. The typical observed laser head response is rather sluggish in that it takes approximately 20 pulses to stabilize at the desired laser energy output level. This uncompensated response is modelled in the following relationship which sets forth the actual transfer function of the uncompensated laser as Equation 1.

$$G_{laser}(s) = \frac{5}{s+5} = \frac{1}{\frac{s}{5}+1} = \frac{1}{\tau s + 1} \qquad \text{Equation 1}$$

In Equation 1, $G_{laser}(s)$ is the actual transfer function of the uncompensated laser head. This mathematical description of the laser system implies a decay constant of 5 sec$^{-1}$ or equivalently, the laser has a time constant, $\tau$, of 1/5 sec. It will be appreciated that the time constant, $\tau$, has a physical meaning related to the decay constant in that they are inverses of one another. It is noted that the smaller the time constant, then correspondingly the faster the system is. Whether the time constant or the decay constant is used to describe the laser head's characteristics, either constant describes the system dynamics accurately for a first order system. Using the time constant description, the laser system will reach steady state output in about 1 second (ie. 5 times the 0.2 second time constant) after laser turn on.

As noted earlier, it is desired that the laser system reach stabilization at nearly 100% output within 4 or 5 shots (output pulses) after turn on when the laser system is firing at a 20 Hz (20 shots/sec) repetition rate. In this example, the time constant, $\tau$, will be approximately 50 mS and the decay constant is approximately 20 sec$^{-1}$. For this example, the desired transfer function of the laser is given by the following Equation 2.

$$G_{laser\ desired}(s) = \frac{1}{\tau_{desired} \cdot s + 1} = \frac{1}{(0.050)s + 1} \qquad \text{Equation 2}$$

$$= \frac{20}{s + 20}$$

The desired laser response expressed in Equation 2 is approximately 4 times faster than the rather slow response expressed in Equation 1. In Equation 2, $G_{laser\ desired}(s)$ represents the desired transfer function of the laser system and $\tau_{desired}$ represents the desired time constant for that system in the first order case.

Figure 6:
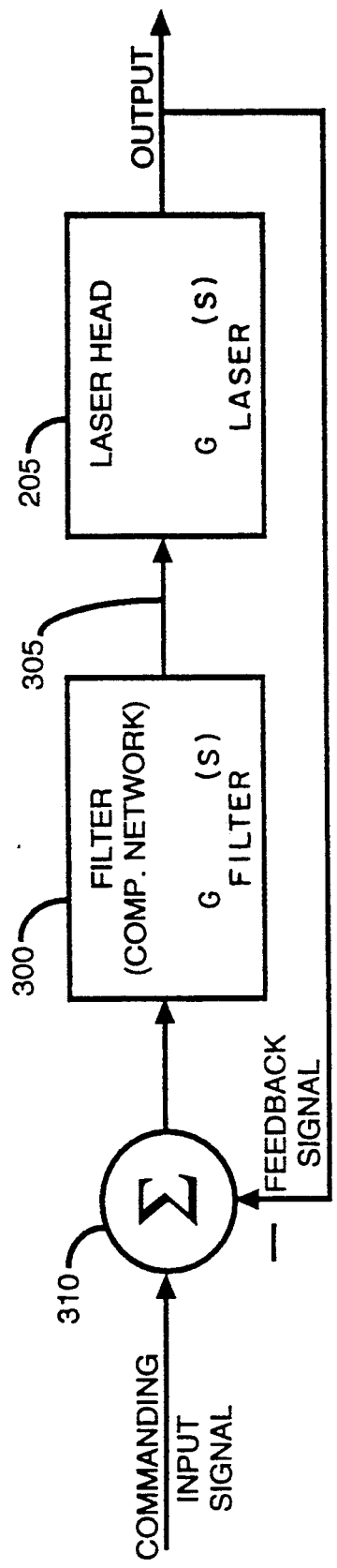
FIG. 6 is a representation of a simplified negative feedback loop arrangement.

Before transforming the laser system into the digital domain, it is noted that FIG. 6 shows an "analog" filter placed in forward path 300. This simplified version of the filtering arrangement is provided for illustration purposes. A commanding input signal and a negative feedback signal are provided to a summing junction 310 as shown. The resulting transfer function, $G_{closed\text{-}loop}(s)$, of this system is given by Equation 3 below.

$$G_{closed\text{-}loop}(s) = \frac{G_{filter}(s) \cdot G_{laser}(s)}{1 + G_{filter}(s) \cdot G_{laser}(s)} \qquad \text{Equation 3}$$

$$= \frac{G_{filter}(s) \cdot \left(\frac{5}{s+5}\right)}{1 + G_{filter}(s) \cdot \left(\frac{5}{s+5}\right)}$$

Further simplification of Equation 3 results in Equation 4A below:

$$G_{closed\text{-}loop}(s) = \frac{G_{filter}(s) \cdot \left(\frac{5}{s+5}\right)}{1 + G_{filter}(s) \cdot \left(\frac{5}{s+5}\right)} \qquad \text{Equation 4A}$$

$$= \frac{5 \cdot G_{filter}(s)}{(s+5) + 5 \cdot G_{filter}(s)}$$

$$= \frac{5 \cdot G_{filter}(s)}{s + 5 \cdot (1 + G_{filter}(s))}$$

As seen from Equation 4A, filter 300 can be selected to alter the overall transfer function. In the present invention, it has been found to be satisfactory to make $G_{filter}(s) = K$, a gain constant. For example, $G_{filter}(s) = 3$ has been found to produce acceptable filtering results. When this gain constant K is made larger and larger, then the overall system transfer function has an appearance similar to the desired laser transfer function with a larger decay constant, $\delta$, and a correspondingly smaller time constant, $\tau$.

By substitution into Equation 4A, it is seen that when $G_{filter}(s) = 3$, then the following overall transfer function set forth in Equation 4B is realized.

$$G_{closed\text{-}loop}(s) = \frac{15}{s + 20} \qquad \text{Equation 4B}$$

$$= \frac{0.75}{(0.050) \cdot s + 1}$$

Figure 7:
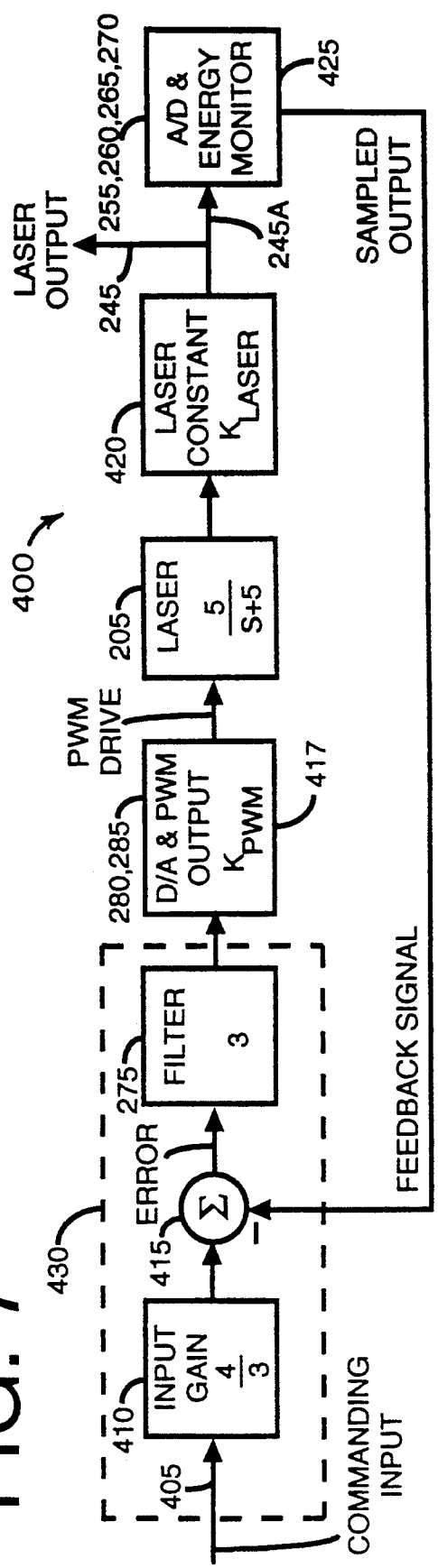
FIG. 7 is a block diagram of another embodiment of the digital filter compensated laser system of the present invention.

FIG. 7 shows one embodiment of the digital filter compensated laser system of the present invention as laser system 400. Laser system 400 is similar in structure to laser system 200 of FIG. 4 with like numbers being used to indicate like elements. For convenience in FIG. 7, energy monitor 255, sampling detector 260, integrator 265 and A/D converter 270 have been combined in system 400 of FIG. 7 as A/D and Energy Monitor 425. D/A converter 280 and drive network 285 have been similarly combined as D/A and PWM output block 417.

A Commanding Input signal 405 is provided to system 400 as shown. Commanding Input signal 405 includes a series of step input commands which commence on laser turn on. More particularly, the Commanding Input signal 405 is supplied to an input gain block 410 exhibiting a gain of 4/3 as shown. The output of gain block 410 is coupled to one input of a two input summing junction 415. The output of summing junction 415 is coupled to a filter 275 which exhibits a transfer function G(s) of 3. The output of filter 275 is coupled to the input of D/A & PWM OUTPUT block 417 formed by D/A converter 280 and PWM drive network 285 as shown. The D/A and PWM OUTPUT block 417 exhibits a gain of $K_{PWM}$ and is coupled to the input of laser head 205. Laser head 205 exhibits a transfer function of $5/(s+5)$ in this particular embodiment. Laser 205 exhibits a gain which is separately characterized by laser constant gain block 420 wherein $K_{LASER}$ is the laser gain.

The main laser output is depicted as laser pulse 245 of which a portion is deflected as laser pulse 245A to A/D and Energy Monitor block 425. Each laser pulse is thus monitored as already described. An energy output level sample (sampled output) is taken for each sample and is provided to the remaining input of summing junction 415 as a negative feedback signal.

With respect to D/A and PWM OUTPUT block 417, it is seen that a 200 μS wide PWM DRIVE output pulse is generated for a given input number (in digital form) received from digital filter 275 and which corresponds to 5 volts. The laser output constant $K_{LASER}$ is set such that the laser head generates the desired 100% output with a 200 μS wide input pulse (PWM DRIVE) into the laser diode after reaching steady state and in ideal temperature, non-aged conditions. The term "non-aged" conditions is used to mean that the laser head is in new condition. A/D converter & energy monitor 425 are calibrated to generate a digital number representing 5 volts when the energy monitor senses that the laser has generated 100% of the desired output energy level. The constant parameters discussed above are summarized as follows in Table 1:

TABLE 1

$K_{PWM} = \left(\frac{200\ \mu S}{5\ V}\right)$, Pulse Width Generator Constant $K_{Laser} = \left(\frac{100\%}{200\ \mu S}\right)$, Laser Constant $K_{EM} = \left(\frac{5\ V}{100\%}\right)$, Energy Monitor Constant In actual practice, input gain block 410, summing junction 415 and digital filter 275 are implemented in a computer, microprocessor, microcontroller or other processor 430.

Commanding Input signal 405 is a 5 volt level (number) which is multiplied by 4/3 at input gain block 410. This generates a number corresponding to 20/3 or 6⅔ at the output of input gain block 410. If the laser output 245 is currently generating at the 100% level, then A/D & Energy Monitor 425 will output a 5 volt level or number which is subtracted by virtue of the negative feedback from the 20/3 number output by input gain block 410. Performing this calculation yields a number equal to 5/3. This number, which is the error signal, is now multiplied by filter gain block 275 (the gain of which is 3 in this embodiment) and yields another number: 5. This "5" which is present at the output of filter gain block 275 is converted by D/A & PWM Output gain block 417 into a pulse width (PWM DRIVE pulse) corresponding to a 200 μS (since $K_{PWM}$ generates a 200 μS wide pulse for a 5 volt input). With this 200 μS PWM DRIVE pulse being supplied to the laser diode of the laser head, the laser head should continue to generate the 100% output energy level. This results in A/D & Energy Monitor block 425 feeding back the sampled output with a number corresponding to 5 volts.

The case where the laser head does not output a full 100% of the desired energy level when driven by a 200 μS wide PWM DRIVE input pulse is now considered. This undesired condition is possibly due to temperature induced decoupling of the laser diode's emission wavelength and the absorption wavelength of the lasing medium or other system degradation. At this point, the laser constant $K_{LASER}$ has changed to the detriment of the system. It is expected that the laser output energy level observed by A/D & Energy Monitor 425 will decrease and correspondingly cause the error signal to increase. With a higher error signal going into filter gain block 275, a larger (that is wider or longer) PWM DRIVE signal pulse is produced and consequently this compensates for the lower generated laser output energy.

However, if the laser output goes above the desired 100% energy output level, then A/D & Energy Monitor 425 will now generate a signal over 5 volts which will cause the error signal to decrease. This reduction in the error signal will cause the PWM DRIVE signal pulse to decrease in width or time duration. Consequently, this reduces the laser energy output level back down to the desired energy output level.

Each of the above described laser output fluctuations due to outside disturbances will cause the system to perturbate slightly from the desired level, but the negative feedback provided by the digital filter control loop will automatically make adjustments to the width of the PWM DRIVE signal to bring the system output back in line with a predetermined energy output setpoint level.

To implement a filter algorithm to achieve the desired filtering characteristics, filter gain block 275 is converted into an equation which is calculated using the sampled input data from the energy monitor. Direct conversion using commonly available z-transform tables yields transfer function for the filter in the z- domain as seen in the following Equation 5.

Equation 5
$$G_{filter}(z) = 3 \cdot \left(\frac{z}{z-1}\right) = 3 \cdot \left(\frac{z}{1-z^{-1}}\right)$$
$$= \left(\frac{3}{1-z^{-1}}\right)$$

Translating Equation 5 into an algorithm that a computer can implement is accomplished by noting that the above transfer function is a ratio of the gain block output to the gain block input and that the $z^{-1}$ term serves as a delay in the implementation of the filter algorithm. More particularly, $$G_{filter}(z) = \frac{Out_{filter}(z)}{In_{filter}(z)} = \frac{N_{filter}(z)}{D_{filter}(z)} \quad \text{Equation 6}$$

or $$(1 - z^{-1}) \cdot Out_{filter}(z) = 3 \cdot In_{filter}(z) \quad \text{Equation 7}$$

wherein $$IN_{filter}(z) = \text{error}(z)$$

and then, $$Out_{next} - Out_{last} = 3 \cdot In_{error} \quad \text{Equation 8}$$

or $$Out_{next} = Out_{last} + 3 \cdot In_{error}$$

From the above, it is seen that the width of the next PWM DRIVE pulse should equal the width of the last PWM DRIVE pulse plus some correction term determined by the measured error. This error is determined by the commanding input and the feedback signal from A/D Converter and Energy Monitor 425 as indicated in FIG. 7. More particularly, Error=(4/3)×Commanding Input−Sampled Output. If the error is positive, in the sense that the measured laser output energy is not as much as the commanded input (ie. the output level is too low), then the next PWM DRIVE pulse is wider than the last. Conversely, if the error is negative which corresponds to the situation where the laser output energy is higher than the commanded input, then the next PWM DRIVE pulse is narrower.

The $z^{-1}$ term denotes the previously generated value of the variable it is multiplying. To explain further, the z terms used in transfer functions have various powers, namely $z^{-1}, z^{-2}, z^{-3}, z^{-4}$ as seen in the general transfer function equation set forth below in Equation 9.

$$\begin{aligned} G(z) &= \frac{N(z)}{D(z)} \\ &= \frac{a_0 z^{-n} + a_1 z^{-(n-1)} + \ldots a_{n-1} z^{-1} + a_n}{b_0 z^{-m} + b_1 z^{-(m-1)} + \ldots b_{m-1} z^{-1} + b_m} \end{aligned} \quad \text{Equation 9}$$

The "variable" on which the z terms act (ie. the denominator terms acting on the output and the numerator terms acting on the input of the gain block) gets assigned a delay based on the power of the z term where such terms have non-zero coefficients. For instance, as in the transfer function of Equation 7, the denominator acts on the output variable which affects the pulse width of the PWM DRIVE signal. Generally, the more powers of z terms used implies a higher order filter and more memory required for remembering previously generated outputs. Similarly, for more powers of z in the numerator, more memory is required to store previously input values.

Comparing the general transfer function of Equation 9 above with the filter gain block transfer function used in the control of the laser apparatus of the present invention, the general coefficients are assigned to the values as shown below together with Equation 10.

$$\begin{aligned} G_{filter}(z) &= \frac{3}{1 - z^{-1}} = \frac{3}{-1 \cdot z^{-1} + 1} \\ &= \frac{a_n}{b_{m-1} z^{-1} + b_m} \end{aligned} \quad \text{Equation 10}$$

wherein:

$a_n = 3$ $b_m = 1$ $b_{m-1} = -1$

These general coefficients, $a_n$, $b_m$ and $b_{m-1}$ fully characterize the digital filter employed in this embodiment of the invention. These are the coefficients used by the digital filter for closed loop control of the laser system of the described embodiment.

Although a digital filter compensated laser apparatus is described above, it is clear that a method of operating the laser apparatus is also disclosed. More specifically, that method includes the steps of a laser source generating a plurality of laser pulses in response to respective drive pulses in a drive signal. The method also includes the step of sampling the energy output of each of the laser pulses to produce a sampled laser energy output signal including a plurality of laser energy output samples. The method further includes the step of converting the sampled laser energy output signal to a digitized sampled signal including a plurality of digitized sample energy values. The method also includes the step of digitally filtering the digitized sample energy values to determine a respective filter value from each digitized sample energy value, the filter value being selected to cancel undesired response characteristics exhibited by the semiconductor laser source and the lasing medium. The method also includes converting each filter value to a count number. The method still further includes the step of generating a respective drive pulse in the drive signal from each count number, the duration of each drive pulse corresponding to a respective count number.

The foregoing describes a laser apparatus which employs a semiconductor laser driving a lasing medium wherein the laser apparatus stabilizes very quickly upon startup. The laser apparatus desirably compensates for aging effects of the semiconductor laser. Moreover, the laser apparatus compensates for other irregularities in the laser system.

While only certain preferred features of the invention have been shown by way of illustration, many modifications and changes will occur to those skilled in the art. It is, therefore, to be understood that the present claims are intended to cover all such modifications and changes which fall within the true spirit of the invention.

I claim:

1. A laser apparatus comprising:

a laser source for generating a plurality of laser pulses in response to respective drive pulses in a drive signal;

sampling means for sampling the energy output of each said laser pulses to produce a sampled laser energy output signal including a plurality of laser energy output samples;

analog to digital conversion means, coupled to said sampling means, for converting said sampled laser energy output signal to a digitized sampled signal including a plurality of digitized sample energy values;

a digital filter, coupled to said analog to digital conversion means, for determining a respective filter value from each digitized sample energy value, said filter value being selected by said filter to cancel undesired response characteristics exhibited by said semiconductor laser source and said lasing medium;

digital to analog conversion means, coupled to said digital filter, for converting each filter value to a count number, and driving means, coupled to said digital to analog conversion means, for generating a respective drive pulse in said drive signal from each count number, the duration of each drive pulse corresponding to a respective count number.

2. A laser apparatus comprising:

a semiconductor laser source for generating a plurality of first laser pulses in response to a drive signal, each of said first laser pulses having a pulse width which varies with the width of a respective drive pulse in said drive signal, each of said first laser pulses being spaced apart in time and occurring in a respective window;

a lasing medium positioned such that said semiconductor laser pumps said lasing medium to produce a laser beam;

an electronic shutter, situated to intercept said laser beam, which opens for a predetermined amount of time in response to a trigger signal during each window to permit emission of a second laser pulse of predetermined duration, a plurality of second laser pulses thus being emitted by said shutter, each of said second laser pulses being emitted during the same respective window as a corresponding first laser pulse;

sampling means for sampling the energy output of each said second laser pulses to produce a sampled laser energy output signal including a plurality of laser energy output samples;

analog to digital conversion means, coupled to said sampling means, for converting said sampled laser energy output signal to a digitized sampled signal including a plurality of digitized sample energy values;

a digital filter, coupled to said analog to digital conversion means, for determining a respective filter value from each digitized sample energy value, said filter value being selected by said filter to cancel undesired response characteristics exhibited by said semiconductor laser source and said lasing medium;

digital to analog conversion means, coupled to said digital filter, for converting each filter value to a count number, and driving means, coupled to said digital to analog conversion means, for generating a respective drive pulse in said drive signal from each count number, the duration of each drive pulse corresponding to a respective count number.

3. The laser apparatus of claim 2 wherein said lasing medium comprises a laser rod.

4. A method of operating a laser apparatus comprising the steps of:

a laser source for generating a plurality of laser pulses in response to respective drive pulses in a drive signal;

sampling the energy output of each of said laser pulses to produce a sampled laser energy output signal including a plurality of laser energy output samples;

converting said sampled laser energy output signal to a digitized sampled signal including a plurality of digitized sample energy values;

digitally filtering said digitized sample energy values to determine a respective filter value from each digitized sample energy value, said filter value being selected to cancel undesired response characteristics exhibited by said semiconductor laser source and said lasing medium;

converting each filter value to a count number, and generating a respective drive pulse in said drive signal from each count number, the duration of each drive pulse corresponding to a respective count number.

5. A method of operating a laser apparatus comprising the steps of:

generating, by a semiconductor laser source, a plurality of first laser pulses in response to a drive signal, each of said first laser pulses having a pulse width which varies with the width of a respective drive pulse of said drive signal, each of said first laser pulses being spaced apart in time and occurring in a respective window;

pumping a lasing medium with said first laser pulses to generate a laser beam;

opening a shutter which intercepts said laser beam, said shutter being opened for a predetermined amount of time in response to a trigger signal during each window to permit emission of a second laser pulse of predetermined duration, a plurality of second laser pulses thus being emitted by said shutter, each of said second laser pulses being emitted during the same respective window as a corresponding first laser pulse;

sampling the energy output of each of said second laser pulses to produce a sampled laser energy output signal including a plurality of laser energy output samples;

converting said sampled laser energy output signal to a digitized sampled signal including a plurality of digitized sample energy values;

digitally filtering said digitized sample energy values to determine a respective filter value from each digitized sample energy value, said filter value being selected to cancel undesired response characteristics exhibited by said semiconductor laser source and said lasing medium;

converting each filter value to a count number, and generating a respective drive pulse in said drive signal from each count number, the duration of each drive pulse corresponding to a respective count number.

* * * * *